US009496289B2

(12) United States Patent
Ahn et al.

(10) Patent No.: US 9,496,289 B2
(45) Date of Patent: Nov. 15, 2016

(54) THIN FILM TRANSISTOR ARRAY PANEL AND MANUFACTURING METHOD THEREOF

(71) Applicant: Samsung Display Co., Ltd., Yongin, Gyeonggi-Do (KR)

(72) Inventors: Jung Ouck Ahn, Cheonan-si (KR); Seung Sok Son, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/552,619

(22) Filed: Nov. 25, 2014

(65) Prior Publication Data

US 2016/0027802 A1    Jan. 28, 2016

(30) Foreign Application Priority Data

Jul. 25, 2014  (KR) .......................... 10-2014-0095095

(51) Int. Cl.
    *H01L 27/12*       (2006.01)
(52) U.S. Cl.
    CPC ......... *H01L 27/124* (2013.01); *H01L 27/1259* (2013.01)
(58) Field of Classification Search
    None
    See application file for complete search history.

(56) References Cited

U.S. PATENT DOCUMENTS

| 8,274,616 | B2 | 9/2012 | Shin et al. |
| 2010/0066933 | A1 | 3/2010 | Oh et al. |
| 2010/0232004 | A1 | 9/2010 | Hiroshima |
| 2013/0020591 | A1* | 1/2013 | Park ............... G02F 1/1368 257/88 |

FOREIGN PATENT DOCUMENTS

| KR | 1020120002048 A | 1/2012 |
| KR | 1020120129644 A | 11/2012 |
| KR | 1020130033827 A | 4/2013 |
| KR | 1020140056862 A | 5/2014 |
| KR | 1020140074479 A | 6/2014 |
| KR | 1020150019593 A | 2/2015 |

* cited by examiner

*Primary Examiner* — Matthew Reames
*Assistant Examiner* — Steven B Gauthier
(74) *Attorney, Agent, or Firm* — Cantor Colburn LLP

(57) ABSTRACT

A thin film transistor array panel includes: a substrate; a gate line and a common voltage line electrically separated from each other and elongated parallel with each other on the substrate; a gate insulating layer on the gate line and the common voltage line; a first passivation layer on the gate insulating layer; a common electrode on the first passivation layer; a second passivation layer on the common electrode; and a pixel electrode and a connection member on the second passivation layer and electrically separated from each other. The connection member is elongated in a horizontal direction parallel with the gate line and connects the common voltage line and the common electrode to each other.

8 Claims, 11 Drawing Sheets

--PRIOR ART--

--PRIOR ART--

--PRIOR ART--

THIN FILM TRANSISTOR ARRAY PANEL AND MANUFACTURING METHOD THEREOF

This application claims priority to Korean Patent Application No. 10-2014-0095095 filed on Jul. 25, 2014, and all the benefits accruing therefrom under 35 U.S.C. §119, the entire contents of which are incorporated herein by reference.

BACKGROUND (a) Field

The invention relates to a thin film transistor array panel and a manufacturing method thereof.

(b) Description of the Related Art

A liquid crystal display is one of the most common types of flat panel displays in use. The liquid crystal display includes two display panels with field generating electrodes, such as a pixel electrode and a common electrode, and a liquid crystal layer interposed therebetween. The liquid crystal display generates an electric field in the liquid crystal layer by applying voltages to the field generating electrodes, determines the direction of liquid crystal molecules of the liquid crystal layer, and controls polarization of incident light through the generated electric field to display images.

In the liquid crystal display, a region in which a gate conductor is disposed is light-blocked by a black matrix. This blocking of light directly influences transmittance of the liquid crystal display. Accordingly, in order to improve transmittance of the liquid crystal display, decreasing a size of the region in which the gate conductor is disposed is desired.

SUMMARY

One or more exemplary embodiment of the invention provides a thin film transistor array panel for improving transmittance by disposing a connection member for connecting a common voltage line and a common electrode to each other, elongated in a horizontal direction that is parallel with a gate line, and a manufacturing method thereof.

An exemplary embodiment of the invention provides a thin film transistor array panel including: a substrate; a gate line and a common voltage line electrically separated from each other and extended parallel with each other on the substrate; a gate insulating layer on the gate line and the common voltage line; a first passivation layer on the gate insulating layer; a common electrode on the first passivation layer; a second passivation layer on the common electrode; and a pixel electrode and a connection member on the second passivation layer and electrically separated from each other. The connection member is elongated in a horizontal direction parallel with the gate line and connects the common voltage line and the common electrode to each other.

The pixel electrode may contact a drain electrode of a thin film transistor via a first contact hole, and the connection member may contact the common voltage line via a second contact hole and contact the common electrode via a third contact hole.

The first contact hole may be defined in the first and second passivation layers, the second contact hole may be defined in the gate insulating layer, the first passivation layer and the second passivation layer, and the third contact hole may be defined in the second passivation layer.

An opened area may be defined in the common electrode, the first and second contact holes may be disposed inside the opened area, and the third contact hole may be disposed outside the opened area.

The first contact hole, the second contact hole and the third contact hole may be arranged in a line parallel to an extension direction of the gate line.

The thin film transistor array panel may further include an organic layer between the first passivation layer and the common electrode.

A first opening may be defined in the organic layer and surrounding the first contact hole, and a second opening may be defined in the organic layer and surrounding the second contact hole.

The pixel electrode may overlap part of the gate line.

Another exemplary embodiment of the invention provides a method for manufacturing a thin film transistor array panel, including: forming a gate conductor including a gate line, a gate electrode and a common voltage line on a substrate; stacking a gate insulating layer on the gate conductor, and forming a data conductor including a data line, a source electrode and a drain electrode on the gate insulating layer; stacking a first passivation layer and an organic layer on the data conductor, and exposing the organic layer to form a first opening and a second opening in the organic layer and exposing the first passivation layer; forming a common electrode and an opened area defined in the common electrode, on the organic layer; stacking a second passivation layer on the first passivation layer, the organic layer and the common electrode; etching the first passivation layer and the second passivation layer to form a first contact hole in the first passivation layer and the second passivation layer and exposing part of the drain electrode, etching the gate insulating layer, the first passivation layer and the second passivation layer to form a second contact hole in the gate insulating layer, the first passivation layer and the second passivation layer and exposing the common voltage line, and etching the second passivation layer to form a third contact hole in the second passivation layer and exposing part the common electrode; and forming a connection member on the second passivation layer, the common voltage line and the common electrode and in connection with the common voltage line and the common electrode.

The connection member may be formed elongated in a horizontal direction parallel with the gate line.

The first and second contact holes may be formed inside the opened area, and the third contact hole may be formed outside the opened area.

The first opening may surround the first contact hole, and the second opening may surround the second contact hole.

The method may further include forming a pixel electrode on the second passivation layer and the drain electrode.

The pixel electrode and the connection member may be electrically separated from each other and simultaneously formed.

The pixel electrode may be formed to overlap the gate line.

According to one or more exemplary embodiment of the invention, the thin film transistor array panel and the manufacturing method thereof form the connection member for connecting the common electrode and the common voltage line, elongated in the horizontal direction parallel with the gate line, thereby improving the aperture ratio of the thin film transistor array panel by reducing the vertical width of the light blocking area and improving transmittance of the thin film transistor array panel by increasing the size of the pixel electrode.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
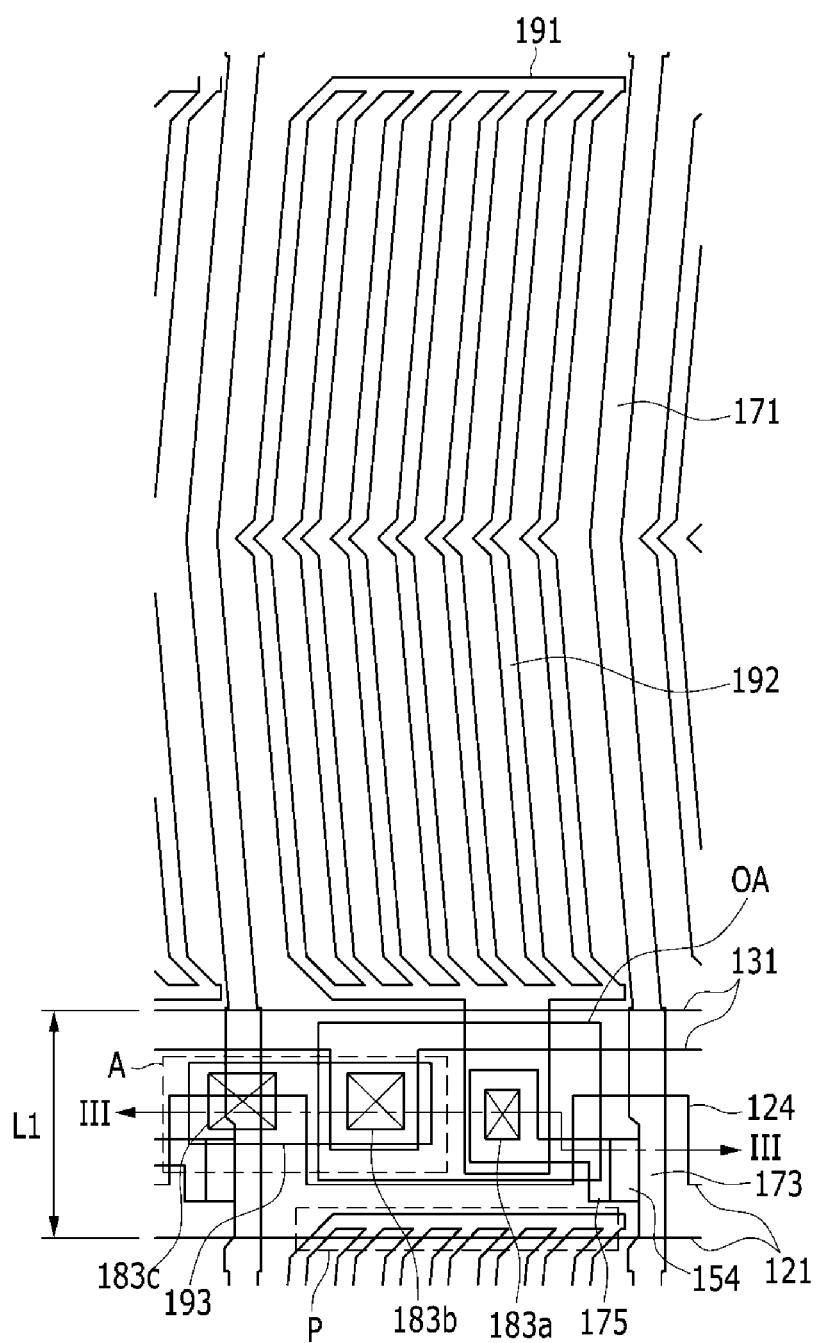
FIG. 1 shows a top plan view of an exemplary embodiment of a thin film transistor array panel according to the invention.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" indicates physical and/or electrical connection.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "upper" may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" side of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Exemplary embodiments of a thin film transistor array panel according to the invention and a manufacturing method thereof will be described with reference to accompanying drawings.

A thin film transistor array panel according to an exemplary embodiment of the invention will be described with reference to FIG. 1 to FIG. 3.

Figure 2:
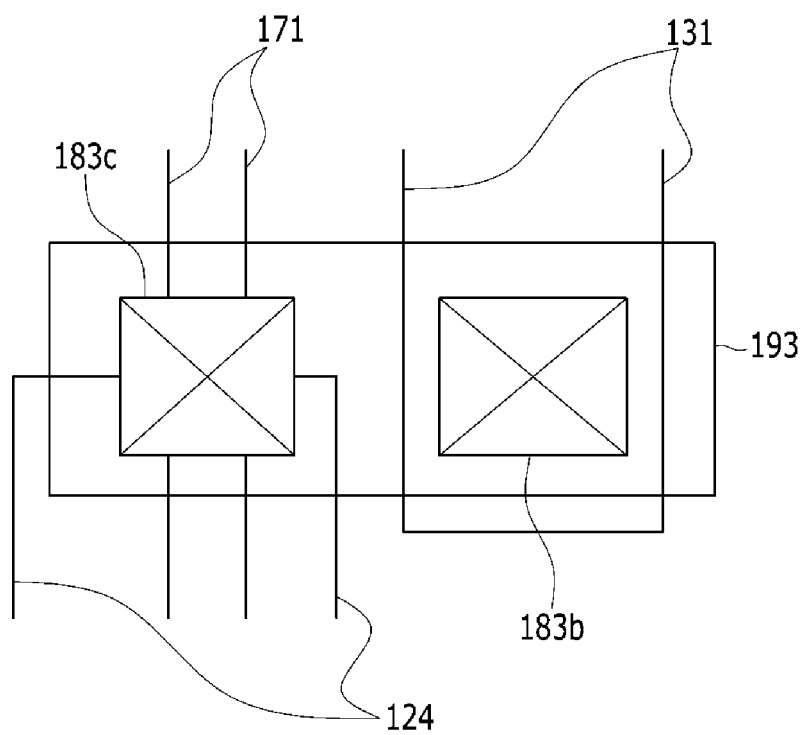
FIG. 2 shows an enlarged view of the thin film transistor array panel with respect to region A shown in FIG. 1.
Figure 3:
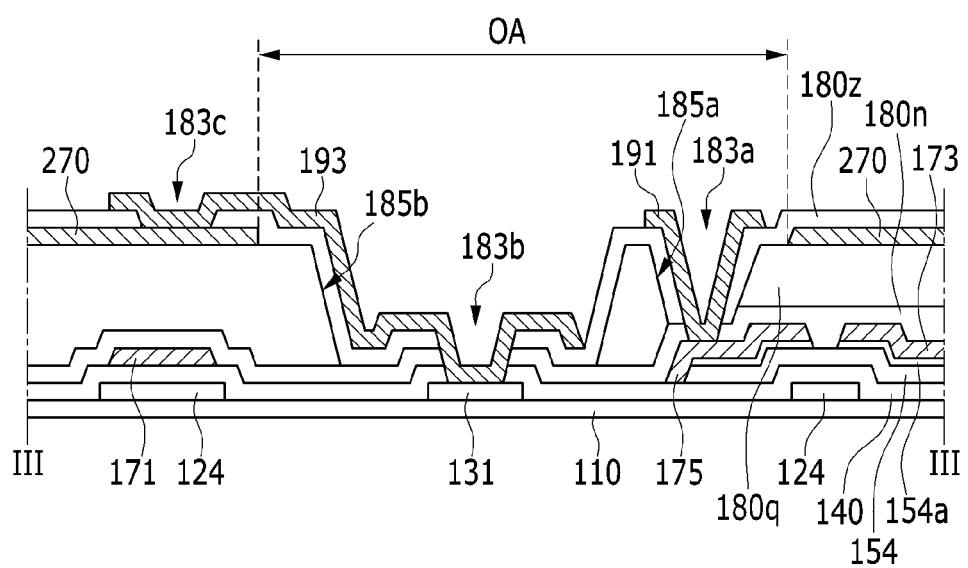
FIG. 3 shows a cross-sectional view of the thin film transistor array panel with respect to line III-III t shown in FIG. 1.

FIG. 1 shows a top plan view of an exemplary embodiment of a thin film transistor array panel according to the invention, FIG. 2 shows an enlarged view a thin film transistor array panel with respect to region A shown in FIG. 1, and FIG. 3 shows a cross-sectional view of an exemplary embodiment of a thin film transistor array panel with respect to line III-III shown in FIG. 1.

Referring to FIG. 1 to FIG. 3, a gate conductor including a gate line 121, a gate electrode 124 and a common voltage line 131 is disposed on an insulation substrate 110 which includes transparent glass or plastic.

The gate line 121 includes a relatively wide end portion (not shown) in the top plan view for connection with another layer of the thin film transistor array panel or an external driving circuit.

The gate line 121 may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like. The gate line 121 may have a single layer structure. However, the gate line 121 may have a multilayer structure including at least two conductive layers with different physical properties.

A gate insulating layer 140 including a silicon nitride (SiNx) or a silicon oxide (SiOx) is disposed on the gate conductor 121. The gate insulating layer 140 may have a multilayer structure including at least two insulating layers with different physical properties.

Particularly, when a semiconductor 154 to be described later includes amorphous silicon, the gate insulating layer 140 includes a silicon nitride (SiNx), and when the semiconductor 154 is an oxide semiconductor, the gate insulating layer 140 includes the silicon nitride (SiNx) and the silicon oxide (SiOx) sequentially stacked.

A second contact hole 183b is defined extended through a thickness of the gate insulating layer 140.

In the top plan view, the common voltage line 131 extends parallel with the gate line 121, includes the same material as the gate line 121 and is in a same layer as the gate line 121. The common voltage line 131 transmits a constant common voltage and includes an extension protruded from a main portion thereof for connection with a common electrode 270.

The semiconductor 154 including amorphous silicon and/or polysilicon is disposed on the gate insulating layer 140. The semiconductor 154 may include an oxide semiconductor.

An ohmic contact 154a is disposed on the semiconductor 154. The ohmic contact 154a may include a material such as n+ hydrogenated amorphous silicon highly doped with an n-type impurity such as phosphorus, or may include a silicide. The ohmic contact 154a may be disposed as a pair on the semiconductor 154. When the semiconductor 154 is an oxide semiconductor, the ohmic contact 154a may be omitted.

A data conductor is disposed on the ohmic contact 154a and the gate insulating layer 140. The data conductor includes a data line 171 including a source electrode 173 and a drain electrode 175.

The data line 171 includes a relatively wide end portion (not shown) in the top plan view for connection with another layer of the thin film transistor array panel or an external driving circuit. The data line 171 transmits a data signal and is extended in a direction crossing the gate line 121 such as in a direction perpendicular to an extension direction of the gate line 121.

The thin film transistor array panel includes a plurality of pixel areas defined therein. In the top plan view, the data line 171 may include a first curved portion so as to acquire maximum transmittance of the liquid crystal display, and the curved portion may be disposed at a center region of a pixel area to form a 'V' shape. At the center region of the pixel area, the data line 171 may further include a second curved portion so as to form a predetermined angle with the first curved portion thereof.

Referring to FIG. 1, the gate line 121 is extended in an x-direction (e.g., horizontal). The first curved portion of the data line 171 may be bent by about 7 degrees with respect to a vertical line (y, a reference line extending in the y-direction) forming an angle of 90 degrees from the x-direction in which the gate line 121 is extended. The second curved portion of the data line 171 disposed in the center region of the pixel area may be further bent from the first curved portion to form an angle of about 7 to 15 degrees with the first curved portion.

The source electrode 173 is part of the data line 171 and is disposed to be extended on the same virtual line in which the data line 171 is extended. The drain electrode 175 is disposed to extend parallel with the source electrode 173. Therefore, the drain electrode 175 is parallel with part of the data line 171.

The gate electrode 124, the source electrode 173 and the drain electrode 175 form a thin film transistor ("TFT") together with the semiconductor 154. A channel of the thin film transistor is disposed at and/or on an exposed portion of the semiconductor 154 between the source electrode 173 and the drain electrode 175.

The data line 171 and the drain electrode 175 may include a refractory metal such as molybdenum, chromium, tantalum and titanium, or an alloy thereof. The data line 171 and the drain electrode 175 may have a multilayer structure including a refractory metal film (not shown) and a low-resistance conductive layer (not shown). Examples of the multilayered structure may include a double layer including a chromium or molybdenum (alloy) lower layer and an aluminum (alloy) upper layer, and a triple layer including a molybdenum (alloy) lower layer, an aluminum (alloy) intermediate layer, and a molybdenum (alloy) upper layer. However, the data line 171 and the drain electrode 175 may include various metals or conductors in addition to the aforementioned structures.

A length or length direction of the data line 171 is defined in the vertical (e.g., y-direction). A width of the data line 171 is taken perpendicular to the length direction of the data line and may be about 3.5 micrometers (μm)±0.75 μm.

A first passivation layer 180n is disposed on the data conductors 171, 173 and 175, the gate insulating layer 140, and the exposed portion of the semiconductor 154. The first passivation layer 180n may include an organic insulating material and/or an inorganic insulating material.

Particularly, when the semiconductor 154 includes amorphous silicon, the first passivation layer 180n includes a silicon nitride (SiNx), and when the semiconductor 154 is an oxide semiconductor, the first passivation layer 180n includes the silicon oxide (SiOx) and the silicon nitride (SiNx) sequentially stacked.

A first contact hole 183a and the second contact hole 183b are defined extended through a thickness of the first passivation layer 180n.

An organic layer 180q is disposed on the first passivation layer 180n.

A first opening 185a is defined extended through the organic layer 180q to surround the first contact hole 183a in the top plan view. A second opening 185b is defined extended through the organic layer 180q to surround the second contact hole 183b in the top plan view. In the top plan view, the first opening 185a has a greater width than that of the first contact hole 183a so as to surround the first contact hole 183a, and the second opening 185b has a greater width than that of the second contact hole 183b so as to surround the second contact hole 183b.

The common electrode 270 is disposed on the organic layer 180q.

The common electrode 270 with a planar shape may be disposed on the entire surface of the insulation substrate 110 as a whole plate. An opened area OA is defined in the common electrode 270 and is disposed in a region corresponding to a periphery of the drain electrode 175.

The opened area OA defined in the common electrode 270 has a rectangular shape in the top plan view.

A second passivation layer 180z is disposed on the common electrode 270.

The second passivation layer 180z may include an organic insulating material and/or an inorganic insulating material.

The first contact hole 183a, the second contact hole 183b and a third contact hole 183c are defined extended through a thickness of the second passivation layer 180z.

The first contact hole 183a and the second contact hole 183b are provided inside the opened area OA of the common electrode 270, and the third contact hole 183c is provided outside the opened area OA of the common electrode 270. The first contact hole 183a, the second contact hole 183b and the third contact hole 183c are arranged in a line extended parallel with the gate line 121. That is, the first, second and third contact holes 183a, 183b and 183c do not overlap in a line taken in the vertical direction.

A pixel electrode 191 is disposed on the second passivation layer 180z to be electrically separated from a connection member 193. The pixel electrode 191 and the connection member 193 may include the same material and be in a same layer of the thin film transistor array panel. In an exemplary embodiment of manufacturing the thin film transistor array panel, the pixel electrode 191 and the connection member 193 may be simultaneously formed through a single process.

In the top plan view, the pixel electrode 191 includes a curved edge that is substantially parallel to the first curved portion and the second curved portion of the data line 171. A plurality of cutouts is defined in the pixel electrode 191 and defines a plurality of first branch electrodes 192 of the pixel electrode.

The pixel electrode 191 is physically and electrically connected to the drain electrode 175 of the thin film transistor via the first contact hole 183a, and receives a voltage from the drain electrode 175.

The connection member 193 on the second passivation layer 180z electrically connects the underlying common electrode 270 and the common voltage line 131 to each other.

In further detail, the connection member 193 contacts the common voltage line 131 via the second contact hole 183b, and contacts the common electrode 270 via the third contact hole 183c.

That is, the common electrode 270 receives a predetermined common voltage from the common voltage line 131 via the connection member 193.

In the top plan view, the connection member 193 is elongated in the horizontal direction that is parallel with the gate line 121 to reduce a width L1 in the vertical direction of a region that is light-blocked by a black matrix (not shown) and improve an aperture ratio of the thin film transistor array panel.

Further, the connection member 193 for connecting the common electrode 270 and the common voltage line 131 to each other is elongated not in the vertical direction but in the horizontal direction, so the pixel electrode 191 overlaps a part P of the gate line 121 to increase a size of the pixel electrode 191 overlying the gate line 121 and accordingly improve transmittance.

A comparative example of a thin film transistor will now be described with reference to FIG. 4 to FIG. 6. Particularly, differences from the previously-described exemplary embodiment of the thin film transistor array panel according to the invention shown in FIG. 1 to FIG. 3 will be described, like constitutional elements will have like reference numerals, and no repeated descriptions of the like constitutional elements will be provided.

Figure 4:
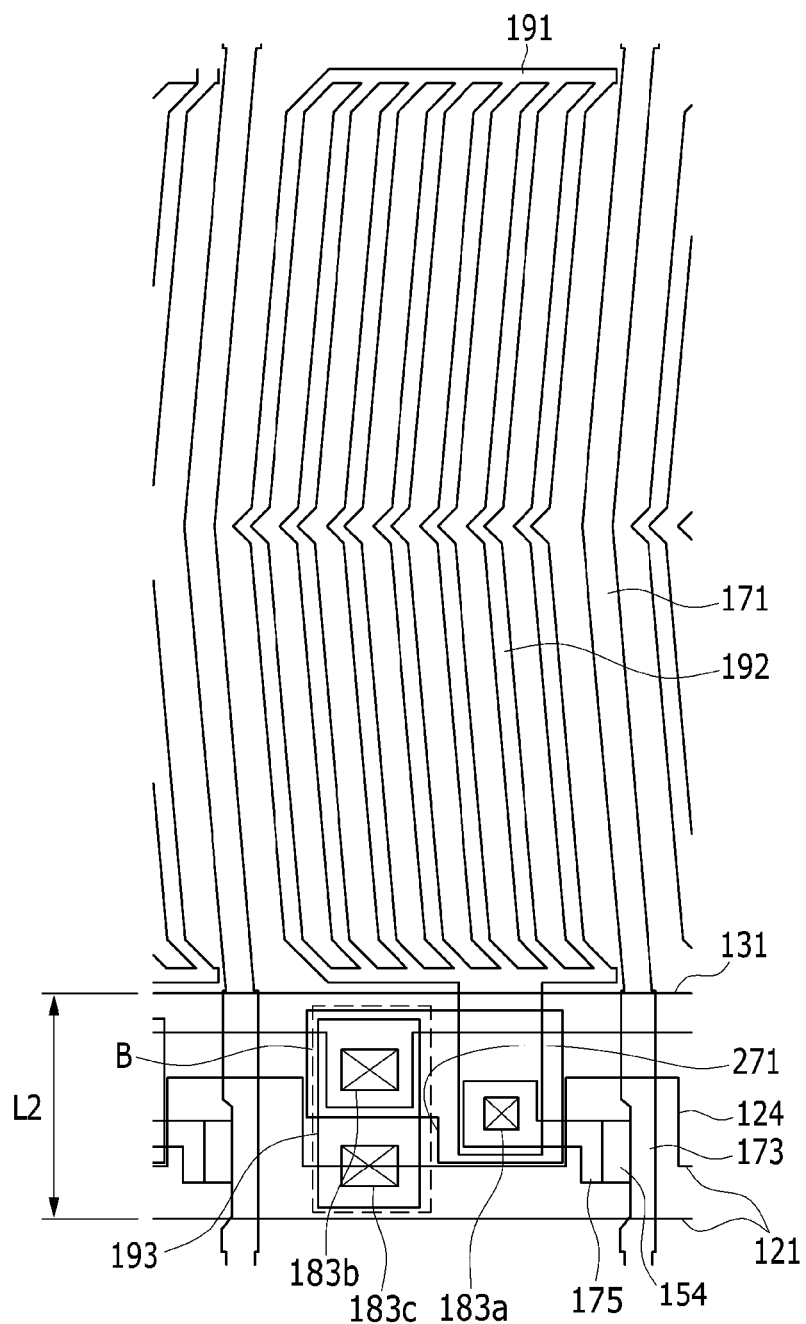
FIG. 4 shows a top plan view of a comparative example of a thin film transistor array panel.
Figure 5:
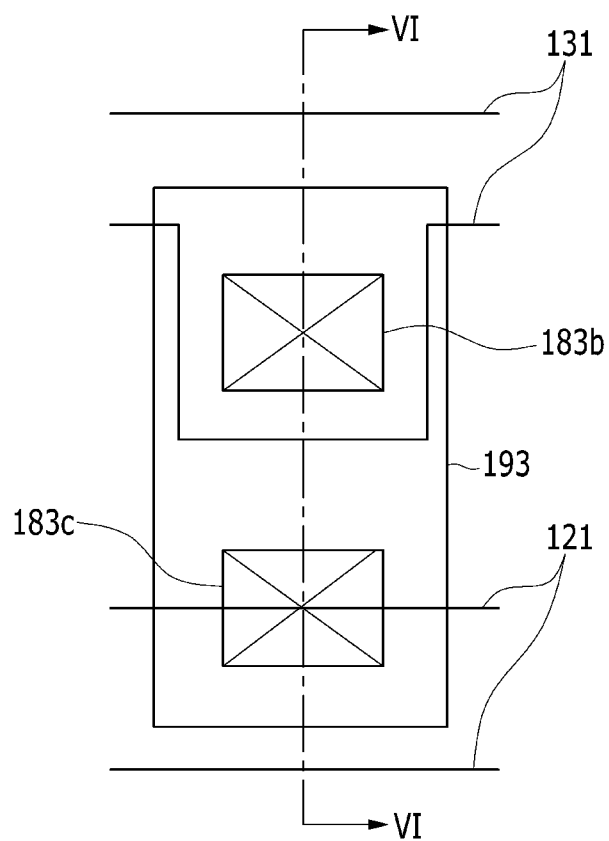
FIG. 5 shows an enlarged region B of the comparative example of a thin film transistor array panel of FIG. 4.
Figure 6:
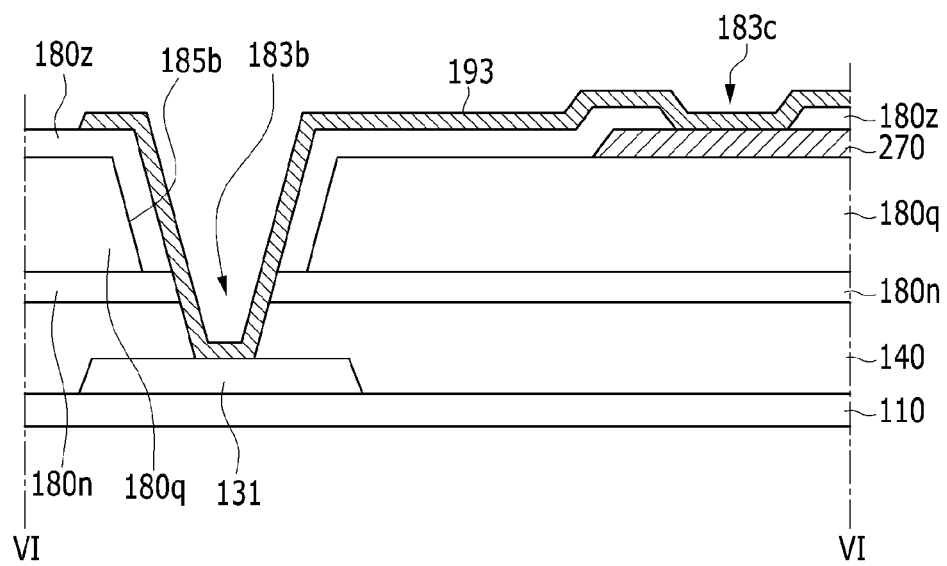
FIG. 6 shows a cross-sectional view of the comparative example of a thin film transistor array panel with respect to a line VI-VI shown in FIG. 5.
Figure 7:
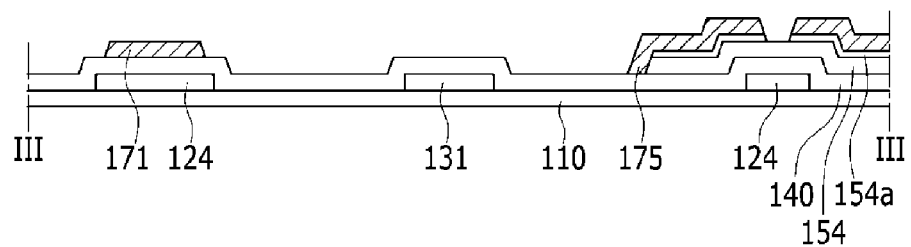
FIG. 7 to FIG. 11 show cross-sectional views of an exemplary embodiment of a method of manufacturing a thin film transistor array panel according to the invention.

FIG. 4 shows a top plan view of a comparative example of a thin film transistor array panel, FIG. 5 shows an enlarged region B of the comparative example of the thin film transistor array panel of FIG. 4, and FIG. 6 shows a cross-sectional view of the comparative example of the thin film transistor array panel with respect to a line VI-VI shown in FIG. 5.

Referring to FIG. 4 to FIG. 6, the common voltage line 131 is electrically connected to the common electrode 270 via the connection member 193.

In further detail, the common voltage line 131 contacts the connection member 193 via the second contact hole 183b, and the common electrode 270 contacts the connection member 193 via the third contact hole 183c.

The second contact hole 183b and the third contact hole 183c form a line parallel with the data line 171. That is, the connection member 193 contacting the common voltage line 131 through the second contact hole 183b and contacting the common electrode 270 through the third contact hole 183c is elongated in the vertical direction that is substantially parallel with the data line 171. In other words, the second and third contact holes 183b and 183c do overlap in a line taken in the vertical direction, different from the exemplary embodiment of the thin film transistor array panel according to the invention shown in FIG. 1 to FIG. 3.

That is, the connection member 193 of the comparative example of the thin film transistor array panel is elongated in the vertical direction that is substantially parallel with the data line 171. The vertical elongation of the connection member limits reduction of a width L2 in the vertical direction of a region in which the gate conductor and the thin film transistor are provided and which is light-blocked by a black matrix.

In contrast, the second contact hole 183b and the third contact hole 183c of the exemplary embodiment of the thin film transistor array panel according to the invention shown in FIG. 1 to FIG. 3 are arranged in a line parallel with the gate line 121. That is, the connection member 193 contacting the common voltage line 131 via the second contact hole 183b and contacting the common electrode 270 via the third contact hole 183c is elongated in the horizontal direction that is parallel with the gate line 121.

Accordingly, compared to the width L2 of the light blocking area included in the comparative example of the thin film transistor array panel, the exemplary embodiment of the thin film transistor array panel according to the invention has a smaller width L1 of the light blocking area and thus improves transmittance.

Further, since the pixel electrode 191 is disposed separated from the connection member 193 which includes a conductor by a predetermined distance in the top plan view, the comparative example of the thin film transistor array panel including the connection member 193 elongated in the vertical direction substantially parallel with the data line 171 limits an increase in the size of the pixel electrode 191 in the vertical direction.

In contrast, the connection member 193 included in the exemplary embodiment of the thin film transistor array panel according to the invention shown in FIG. 1 to FIG. 3 is elongated in the horizontal direction that is parallel with the gate line 121. That is, a vertical side of the connection member 193 is relatively short so that the vertical direction size of the pixel electrode 191 may be increased by overlapping the pixel electrode 191 with a part P of the underlying gate line 121, and transmittance of the thin film transistor array panel is resultantly improved.

A method for manufacturing a thin film transistor array panel according to the invention will now be described with reference to FIG. 7 to FIG. 11.

FIG. 7 to FIG. 11 show cross-sectional views of an exemplary embodiment of a process for manufacturing a thin film transistor array panel according to the invention, relating to the thin film transistor array panel described with reference to FIG. 1 to FIG. 3.

Referring to FIG. 1 to FIG. 3 and FIG. 7, a gate conductor including a gate line 121, a gate electrode 124 and a common voltage line 131 is formed on an insulation substrate 110 including transparent glass or plastic.

The gate conductor may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like.

A gate insulating layer 140 is stacked on the gate conductor.

A semiconductor 154 is formed on the gate insulating layer 140 The semiconductor 154 may include amorphous silicon or polysilicon, and may also be formed with an oxide semiconductor. The oxide semiconductor exemplarily includes indium gallium zinc oxide (In—Ga—Zn—O), zinc oxide (ZnO), and indium zinc oxide (InZnO).

When the semiconductor 154 is formed of amorphous silicon, the gate insulating layer 140 is formed with a silicon nitride (SiNx), and when the semiconductor 154 is an oxide semiconductor, the gate insulating layer 140 is formed by sequentially stacking the silicon nitride (SiNx) and a silicon oxide (SiOx).

An ohmic contact 154a may be formed on the semiconductor 154, and when the semiconductor 154 is an oxide semiconductor, the ohmic contact 154a may be omitted.

A data conductor including, a data line 171, a source electrode 173 and a drain electrode 175 is formed on the gate insulating layer 140 and the semiconductor 154.

The data conductor may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like.

Figure 8:
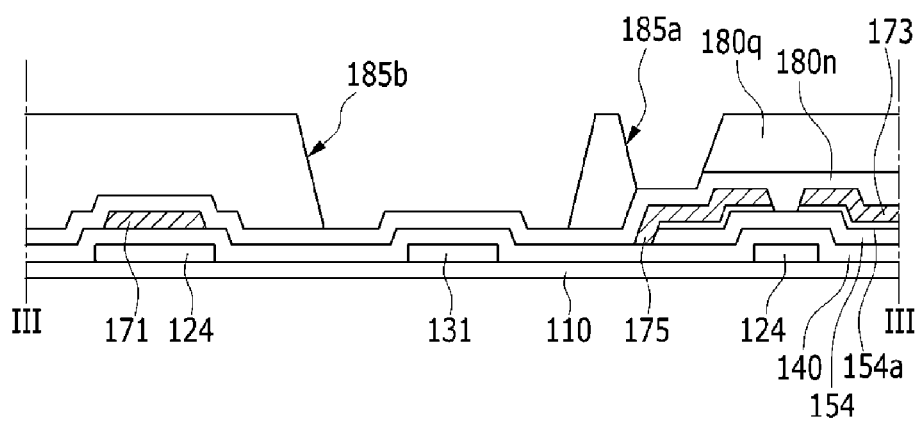

Referring to FIG. 8, a first passivation layer 180n and an organic layer 180q are sequentially stacked on the data conductor. The organic layer 180q is exposed to form a first opening 185a and a second opening 185b which expose part of the first passivation layer 180n.

The first passivation layer 180n is formed with a silicon nitride (SiNx) when the semiconductor 154 includes amorphous silicon. The first passivation layer 180n may be formed by sequentially stacking a silicon oxide (SiOx) and the silicon nitride (SiNx) when the semiconductor 154 is an oxide semiconductor.

The organic layer 180q may be formed with an organic insulating material such as a photoacryl or benzocyclobutene ("BCB").

Figure 9:
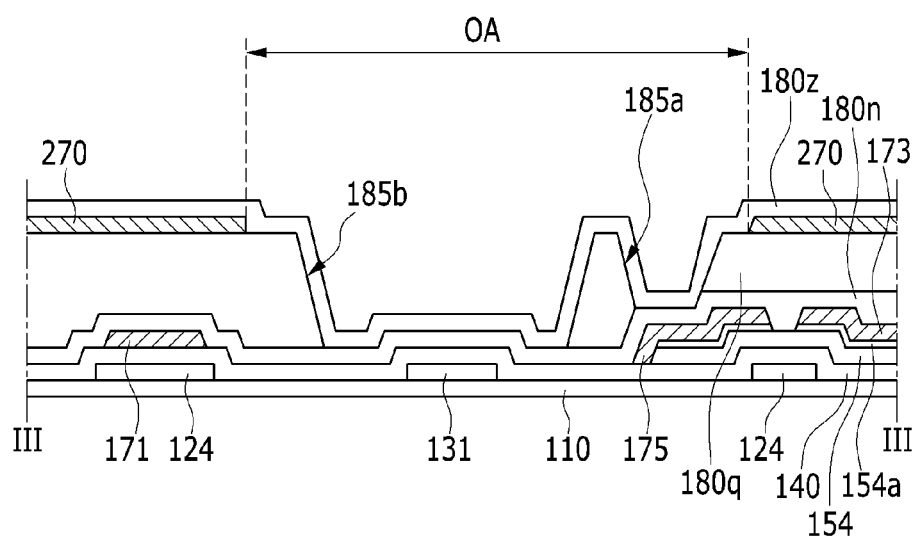

Referring to FIG. 1 and FIG. 9, a common electrode 270 and an opened area OA defined in the common electrode 270 are formed on the organic layer 180q.

The common electrode 270 with a planar shape may be formed on the entire surface of the insulation substrate 110 as a whole plate, and the opened area OA is disposed in a region that corresponds to a periphery of the drain electrode 175 and has a rectangular shape in the top plan view.

A second passivation layer 180z is stacked on the first passivation layer 180n, the organic layer 180q and the common electrode 270.

Figure 10:
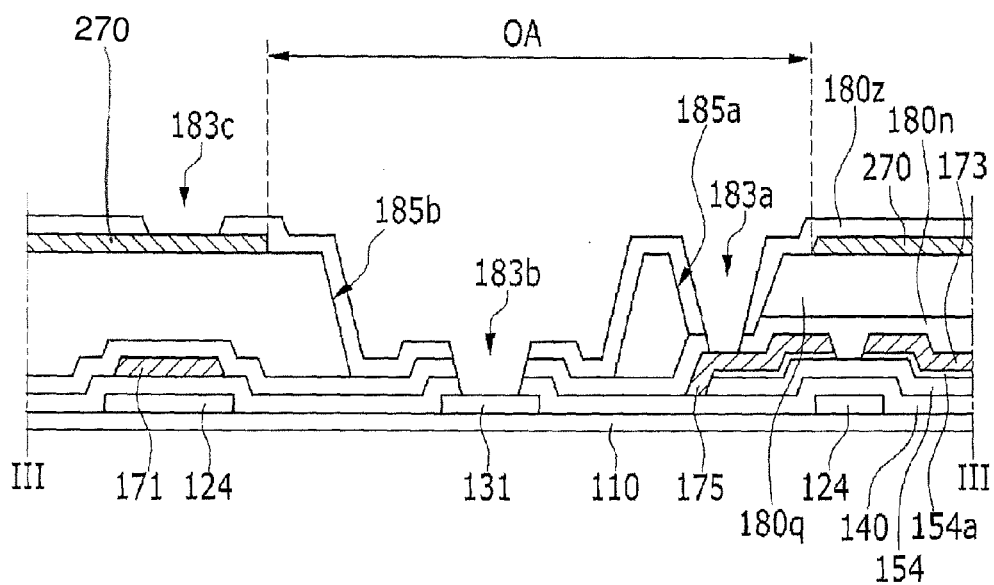

Referring to FIG. 1 and FIG. 10, a first contact hole 183a, a second contact hole 183b and a third contact hole 183c extending through the second passivation layer 180z are formed.

The first contact hole 183a is formed in the first passivation layer 180n and the second passivation layer 180z to expose part of the drain electrode 175, the second contact hole 183b is formed in the gate insulating layer 140, the first passivation layer 180n and the second passivation layer 180z to expose part of the common voltage line 131, and the third contact hole 183c is formed in the second passivation layer 180z to expose part of the common electrode 270.

Here, the first contact hole 183a is surrounded by the first opening 185a, and the second contact hole 183b is surrounded by the second opening 185b, in the top plan view. That is, dimensions of the first opening 185a are formed to be larger than those of the first contact hole 183a, and dimensions of the second opening 185b are formed to be larger than those of the second contact hole 183b.

The first contact hole 183a and the second contact hole 183b are formed inside the opened area OA, and the third contact hole 183c is formed outside the opened area OA.

The first contact hole 183a, the second contact hole 183b and the third contact hole 183c are formed to be aligned in parallel with the gate line 121.

Figure 11:
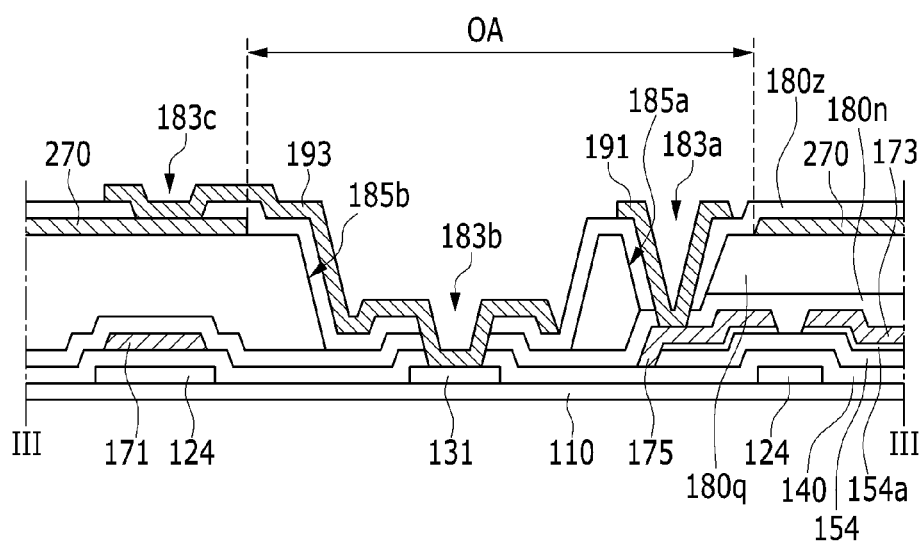

Referring to FIG. 1 and FIG. 11, a connection member 193 is formed on the second passivation layer 180z, the common voltage line 131 and the common electrode 270, and a pixel electrode 191 is formed on the second passivation layer 180z and the drain electrode 175. The connection member 193 and the pixel electrode 191 are electrically separated from each other and may be simultaneously formed in a single process.

The connection member 193 contacts the common voltage line 131 via the second contact hole 183b and contacts the common electrode 270 via the third contact hole 183c. That is, the common electrode 270 is connected to the common voltage line 131 via the connection member 193 to receive a common voltage from the common voltage line 131.

In this instance, the connection member 193 is formed to be elongated parallel with the gate line 121 and is formed elongated in the horizontal direction of the top plan view.

The pixel electrode 191 contacts the drain electrode 175 via the first contact hole 183a. The pixel electrode 191 may be formed to overlap part of the gate line 121 in the top plan view.

One or more exemplary embodiment of the thin film transistor array panel and the manufacturing method thereof according to the invention form the connection member for connecting the common electrode and the common voltage line, elongated in the horizontal direction that is parallel with the gate line, thereby improving the aperture ratio of the thin film transistor array panel by reducing the vertical width of the light blocking area and improving transmittance by increasing the size of the pixel electrode.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film transistor array panel comprising:
   a substrate;
   a gate line and a common voltage line electrically separated from each other on the substrate;
   a gate insulating layer on the gate line and the common voltage line;
   a first passivation layer on the gate insulating layer;
   a common electrode on the first passivation layer;
   a second passivation layer on the common electrode; and
   a pixel electrode and a connection member on the second passivation layer and electrically separated from each other,
   wherein
   each of the gate line, the common voltage line and the connection member define a length thereof which is larger than a width thereof,
   lengths of the gate line, the common voltage line and the connection member are extended parallel with each other, and
   the connection member of which the length thereof is parallel to that of the gate line and the common voltage line connects the common voltage line and the common electrode to each other.

2. The thin film transistor array panel of claim 1, wherein
   the pixel electrode contacts a drain electrode of a thin film transistor via a first contact hole, and
   the connection member contacts the common voltage line via a second contact hole and contacts the common electrode via a third contact hole.

3. The thin film transistor array panel of claim 2, wherein
   the first contact hole is defined in the first and second passivation layers,
   the second contact hole is defined in the gate insulating layer, the first passivation layer and the second passivation layer, and
   the third contact hole is defined in the second passivation layer.

4. The thin film transistor array panel of claim 3, wherein in a top plan view,
   the common electrode overlaps the gate line and the common voltage line;
   an opened area is defined in the common electrode,
   the first and second contact holes are disposed inside the opened area, and
   the third contact hole is disposed outside the opened area.

5. The thin film transistor array panel of claim 4, wherein the first contact hole, the second contact hole and the third contact hole are arranged in a line parallel with the length of the gate line.

6. The thin film transistor array panel of claim 2, further comprising
   an organic layer between the first passivation layer and the common electrode.

7. The thin film transistor array panel of claim 6, wherein
   a first opening is defined in the organic layer and surrounds the first contact hole, and
   a second opening is defined in the organic layer and surrounds the second contact hole.

8. The thin film transistor array panel of claim 1, wherein in a top plan view,
   the pixel electrode defines outer edges thereof, and
   among the outer edges of the pixel electrode, an outer edge of the pixel electrode facing the connection member overlaps the gate line.

* * * * *